United States Patent
Chen et al.

(10) Patent No.: US 11,818,887 B2
(45) Date of Patent: Nov. 14, 2023

(54) ERASABLE PROGRAMMABLE SINGLE-POLY NON-VOLATILE MEMORY CELL AND ASSOCIATED ARRAY STRUCTURE

(71) Applicant: eMemory Technology Inc., Hsin-Chu (TW)

(72) Inventors: Hsueh-Wei Chen, Hsinchu County (TW); Woan-Yun Hsiao, Hsinchu County (TW); Wei-Ren Chen, Hsinchu County (TW); Wein-Town Sun, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 127 days.

(21) Appl. No.: 17/686,573

(22) Filed: Mar. 4, 2022

(65) Prior Publication Data

US 2023/0119398 A1 Apr. 20, 2023

Related U.S. Application Data

(60) Provisional application No. 63/255,466, filed on Oct. 14, 2021.

(51) Int. Cl.
| | | |
|---|---|---|
| *G11C 16/04* | (2006.01) | |
| *H10B 41/70* | (2023.01) | |
| *H10B 41/35* | (2023.01) | |
| *G11C 16/10* | (2006.01) | |
| *G11C 16/14* | (2006.01) | |
| *G11C 16/26* | (2006.01) | |

(52) U.S. Cl.
CPC ........... *H10B 41/70* (2023.02); *G11C 16/045* (2013.01); *G11C 16/10* (2013.01); *G11C 16/14* (2013.01); *G11C 16/26* (2013.01); *H10B 41/35* (2023.02)

(58) Field of Classification Search
CPC .................................................. H01L 27/11524
See application file for complete search history.

(56) References Cited

U.S. PATENT DOCUMENTS

| | | |
|---|---|---|
| 7,889,553 B2 | 2/2011 | Terzioglu et al. |
| 8,941,167 B2 | 1/2015 | Chen et al. |
| 9,293,468 B2 | 3/2016 | Park et al. |
| 9,805,806 B2 | 10/2017 | Chen et al. |
| 2007/0228451 A1* | 10/2007 | Georgescu ............. H10B 69/00 438/257 |
| 2020/0091168 A1 | 3/2020 | Hsu |

FOREIGN PATENT DOCUMENTS

KR    20080020571 A    3/2008

OTHER PUBLICATIONS

Search report issued by EPO dated Aug. 8, 2022.

* cited by examiner

*Primary Examiner* — Jason Lappas
(74) *Attorney, Agent, or Firm* — WPAT, P.C

(57) ABSTRACT

An erasable programmable single-poly non-volatile memory cell and an associated array structure are provided. In the memory cell of the array structure, the assist gate region is composed at least two plate capacitors. Especially, the assist gate region at least contains a poly/poly plate capacitor and a metal/poly plate capacitor. The structures and the fabricating processes of the plate capacitors are simple. In addition, the uses of the plate capacitors can effectively reduce the size of the memory cell.

13 Claims, 10 Drawing Sheets

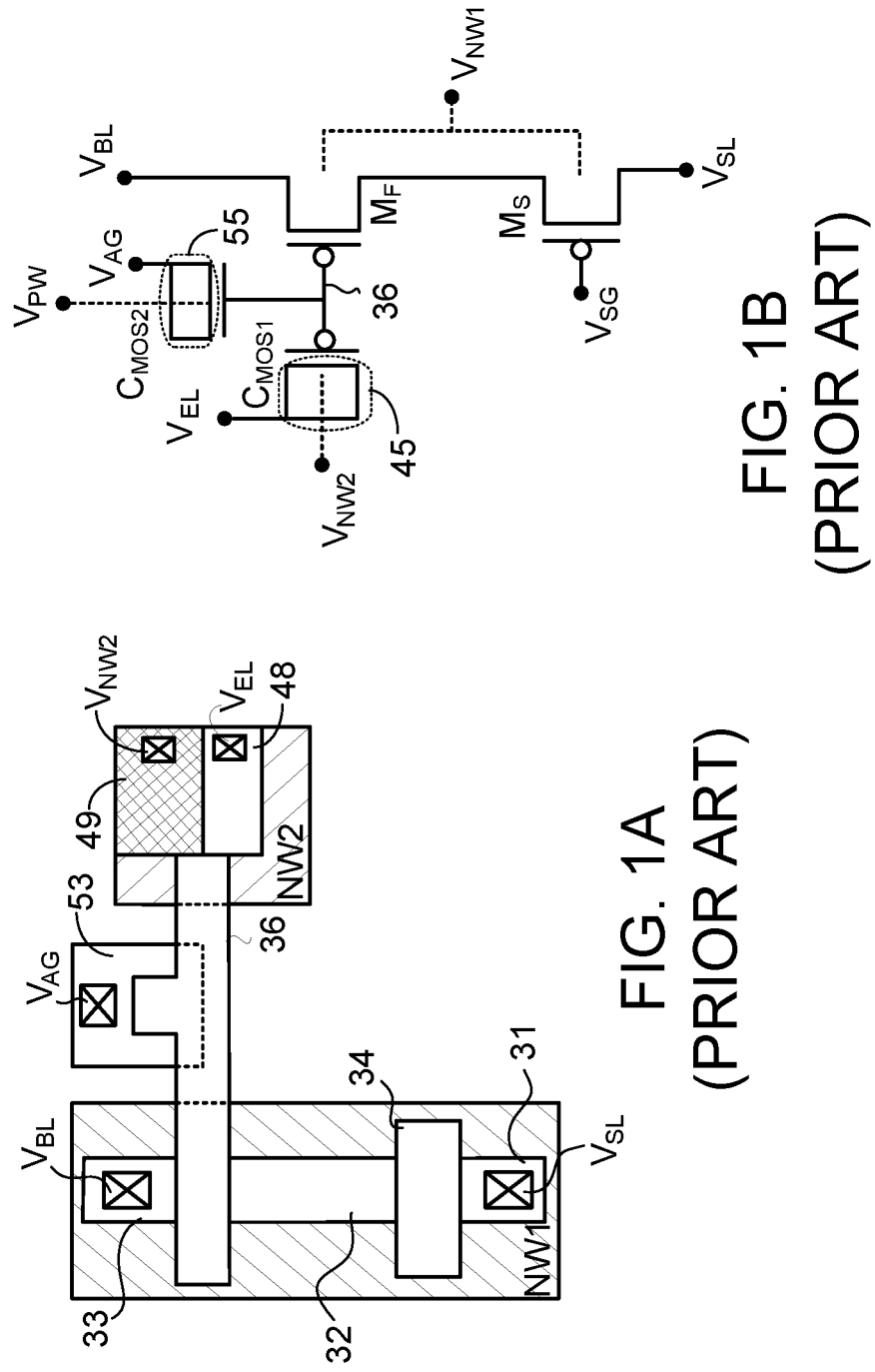

|     | SL | PW | SG | BL | EL | AG |
|-----|----|----|----|----|----|----|
| PGM | 0V | 0V | $V_{PP}$ | $V_{PP}$ | $0V \sim V_{EE}$ | $0V \sim V_{AG}$ |
| ERS | 0V | 0V | 0V | 0V | $V_{EE}$ | $-V_{AG} \sim 0V$ |
| Read | 0V | 0V | $V_R$ | $V_R$ | 0V | $-V_{AG} \sim V_{AG}$ |
FIG. 3A
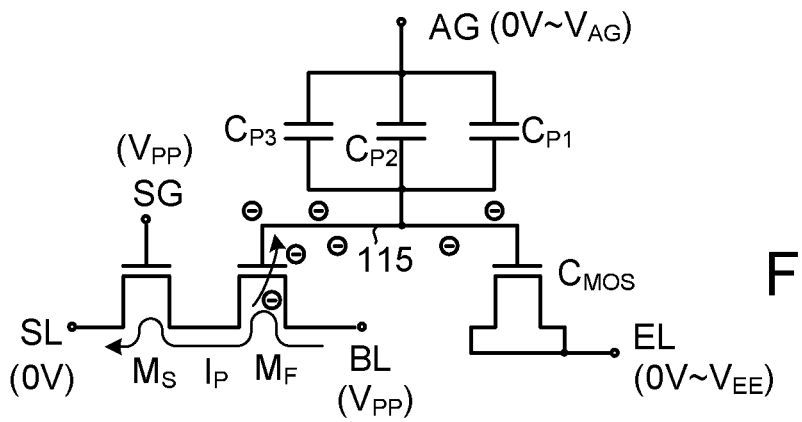
FIG. 3B
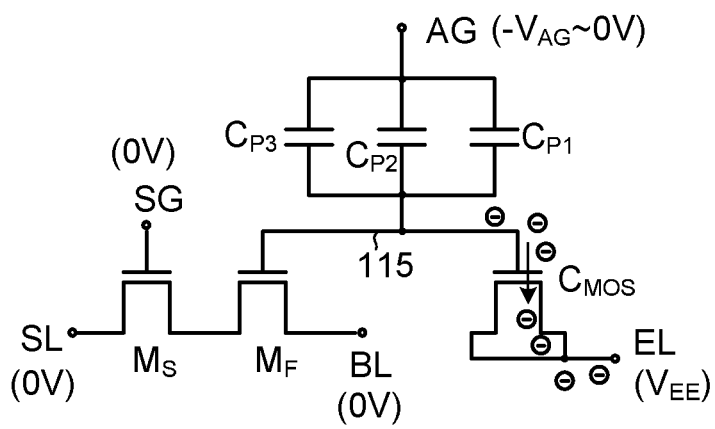
FIG. 3C
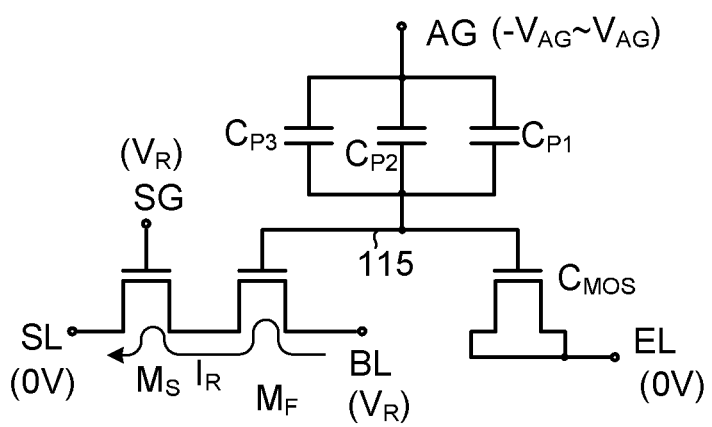
FIG. 3D

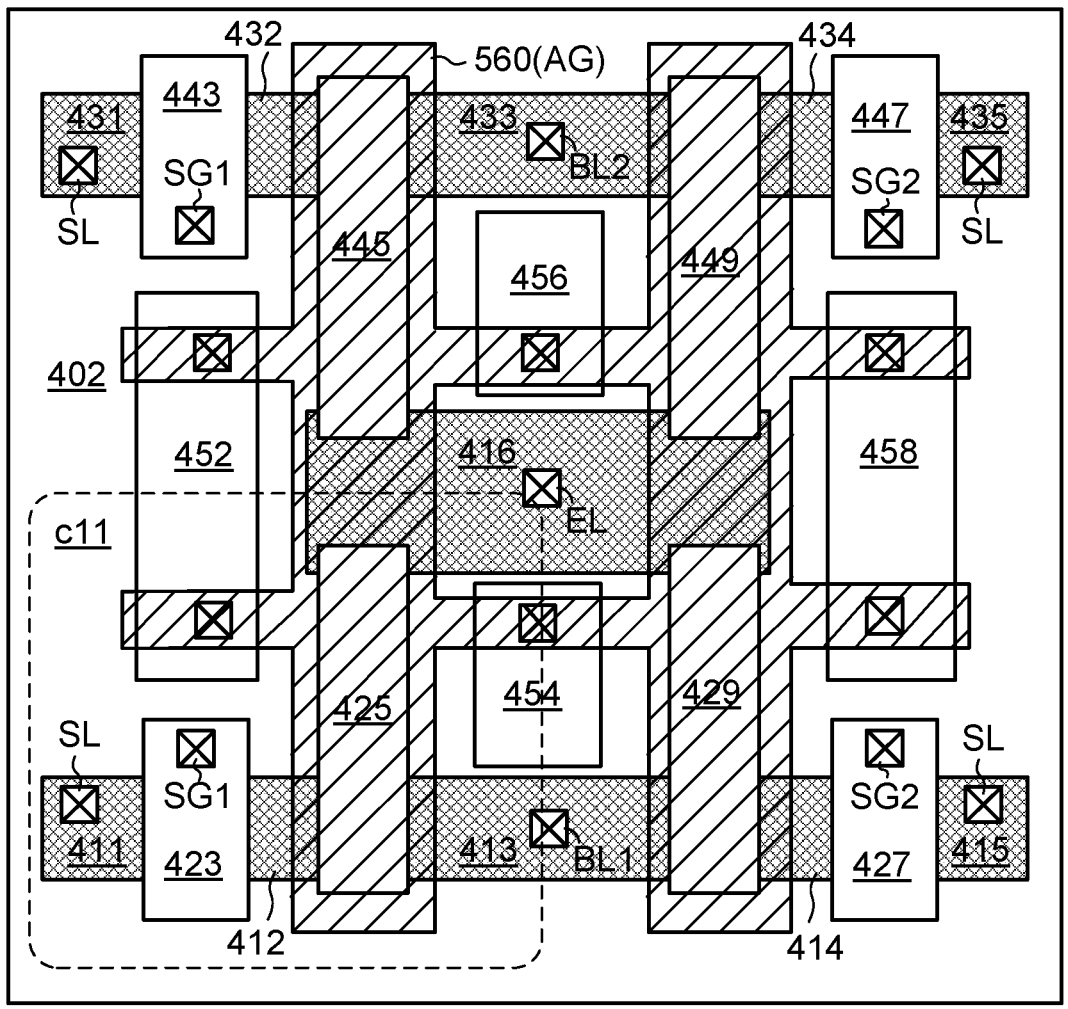
FIG. 4A
FIG. 4B
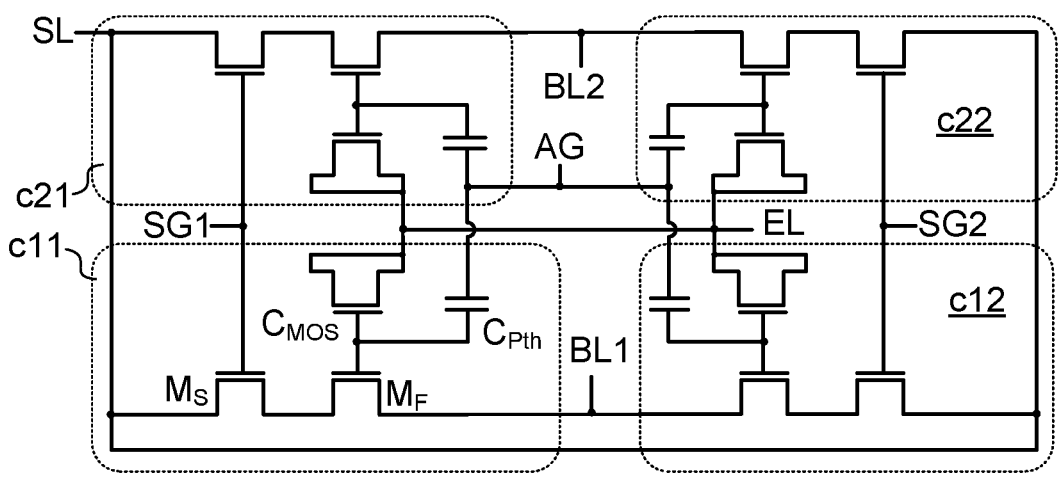

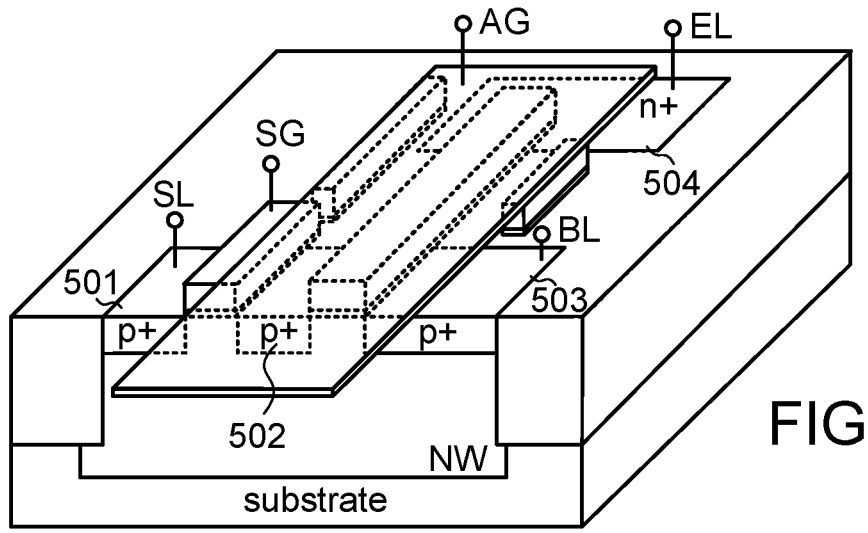
FIG. 5A
| | SL | NW | SG | BL | EL | AG |
|---|---|---|---|---|---|---|
| PGM | $V_{PP}$ | $V_{PP}$ | 0V | 0V | 0V~$V_{EE}$ | 0V~$V_{AG}$ |
| ERS | 0V | 0V | 0V | 0V | $V_{EE}$ | -$V_{AG}$~0V |
| Read | $V_R$ | $V_R$ | 0V | 0V | 0V | -$V_{AG}$~$V_{AG}$ |
FIG. 5B
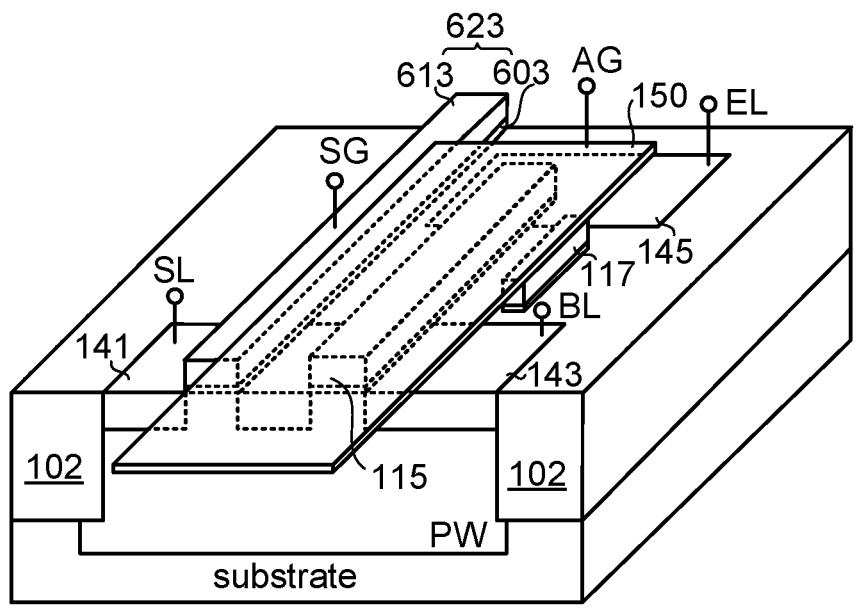
FIG. 6A

ERASABLE PROGRAMMABLE SINGLE-POLY NON-VOLATILE MEMORY CELL AND ASSOCIATED ARRAY STRUCTURE

This application claims the benefit of U.S. provisional application Ser. No. 63/255,466, filed Oct. 14, 2021, the subject matter of which is incorporated herein by reference.

FIELD OF THE INVENTION

The present invention relates to a non-volatile memory, and more particularly to an erasable programmable single-poly non-volatile memory cell and an associated array structure.

BACKGROUND OF THE INVENTION

As is well known, a memory cell of a non-volatile memory comprises a storage unit. For example, the storage unit is a floating gate transistor. The storage state of the memory cell is determined according to the number of charges stored in the floating gate of the floating gate transistor.

In order to be compatible with the standard CMOS manufacturing process, the memory cell of the conventional non-volatile memory is equipped with a single-poly floating gate transistor. The floating gate transistor and associated electronic devices are collaboratively formed as a single-poly non-volatile memory cell.

For example, an erasable programmable single-poly non-volatile memory is disclosed in U.S. Pat. No. 8,941,167. FIG. 1A is a schematic top view illustrating a conventional single-poly non-volatile memory cell. FIG. 1B is a schematic equivalent circuit diagram of the single-poly non-volatile memory cell as shown in FIG. 1A. For succinctness, the single-poly non-volatile memory cell is referred hereinafter as a memory cell.

As shown in FIG. 1A, three p-type doped regions 31, 32 and 33 are formed in an N-well region NW1. In addition, a select gate 34 and a floating gate 36 formed of a polysilicon layer are spanned over the areas between the p-type doped regions 31, 32 and 33. The floating gate 36 is externally extended to a region beside a p-type doped region 48 and an n-type doped region 49. The p-type doped region 48 and the n-type doped region 49 are formed in an N-well region NW2. In addition, the floating gate 36 is also located beside an n-type doped region 53.

The conventional single-poly non-volatile memory cell comprises a select transistor Ms, a floating gate transistor MF, a p-type transistor and an n-type transistor. The select transistor Ms and the floating gate transistor MF are constructed in the N-well region NW1. The p-type transistor is constructed in the N-well region NW2. The n-type transistor is constructed in a P-well region PW (not shown), which is located under the n-type doped region 53.

The p-type doped region 31, the p-type doped region 32, the select gate 34 and the N-well region NW1 are collaboratively formed as the select transistor Ms. The p-type doped region 32, the p-type doped region 33, the floating gate 36 and the N-well region NW1 are collaboratively formed as the floating gate transistor MF. The floating gate 36 and an erase gate region 45 are collaboratively formed as the p-type transistor. The floating gate 36 and an assist gate region 55 are collaboratively formed as the n-type transistor. In addition, the erase gate region 45 comprises the N-well region NW2, the p-type doped region 48 and the n-type doped region 49. The assist gate region 55 comprises the P-well region PW and the n-type doped region 53.

Please refer to FIG. 1B. The select gate 34 of the select transistor Ms receives a select gate voltage $V_{SG}$. The first drain/source terminal of the select transistor Ms receives a source line voltage $V_{SL}$. The body terminal of the select transistor Ms receives an N-well voltage $V_{NW1}$. The first drain/source terminal of the floating gate transistor MF is connected to the second drain/source terminal of the select transistor Ms. The second drain/source terminal of the floating gate transistor MF receives a bit line voltage $V_{BL}$. The body terminal of the floating gate transistor MF receives the N-well voltage $V_{NW1}$.

Moreover, it is regarded that the two drain/source terminals of the p-type transistor are connected to the p-type doped region 48. The body terminal of the p-type transistor receives an N-well voltage $V_{NW2}$. That is, the p-type transistor is formed as a metal-oxide-semiconductor capacitor $C_{MOS1}$. Hereinafter, the metal-oxide-semiconductor capacitor is also referred as a MOS capacitor. The first terminal of the MOS capacitor $C_{MOS1}$ is connected to the floating gate 36. The second terminal of the MOS capacitor $C_{MOS1}$ receives an erase line voltage $V_{EL}$.

Similarly, it is regarded that the two drain/source terminals of the n-type transistor are connected to the n-type doped region 53. The body terminal of the n-type transistor receives a P-well voltage $V_{PW}$. That is, the p-type transistor is formed as a MOS capacitor $C_{MOS2}$. The first terminal of the MOS capacitor $C_{MOS2}$ is connected to the floating gate 36. The second terminal of the MOS capacitor $C_{MOS2}$ receives an assist gate voltage $V_{AG}$.

By providing proper bias voltages as the select gate voltage $V_{SG}$, the source line voltage $V_{SL}$, the bit line voltage $V_{BL}$, the erase line voltage $V_{EL}$, the assist gate voltage $V_{AG}$, the N-well voltage $V_{NW1}$, the N-well voltage $V_{NW2}$ and the P-well voltage $V_{PW}$, a program action, an erase action or a read action can be selectively performed on the non-volatile memory cell.

In the assist gate region 55, the second terminal of the MOS capacitor $C_{MOS2}$ receives the assist gate voltage $V_{AG}$. While the program action, the erase action or the read action is performed, the assist gate voltage $V_{AG}$ is coupled to the floating gate 36 in order to enhance the programming efficiency, the erasing efficiency or the reading speed of non-volatile memory cell.

In the conventional non-volatile memory cell, the assist gate region 55 is a MOS capacitor composed of the n-type transistor. In other words, the process of fabricating the assist gate region 55 is complicated. It is necessary to form the P-well region PW in a substrate and then perform the procedure of forming the n-type doped region 53. In addition, the arrangement of the conventional assist gate region 55 also increases the size of the non-volatile memory cell.

SUMMARY OF THE INVENTION

An embodiment of the present invention provides an array structure of erasable programmable non-volatile memory cells. The array structure is constructed in a substrate. The array structure includes an isolation structure, a first well region, a second well region, a first gate structure, a second gate structure, a third gate structure, a first doped region, a second doped region, a third doped region, a fourth doped region and a metal layer. The isolation structure is formed on the substrate. A surface of the substrate is divided into a first region and a second region by the isolation structure. The first well region is formed in the surface of the substrate corresponding to the first region. The second well region is formed in the surface of the substrate corresponding to the second region. The first gate structure and the second gate structure are formed on the surface of the first region. The first region is divided into a first doped region, a second doped region and a third doped region by the first gate structure and the second gate structure. The first gate structure is connected to a first select gate line. The second gate structure is extended externally to the second region through a surface of the isolation structure. A portion of the second region is covered by the second gate structure. The third gate structure is formed on the isolation structure and located beside a first side of the second gate structure. The first doped region is connected to a source line. The third doped region is connected to a first bit line. The fourth doped region is formed in the surface of the substrate corresponding to the second region. The fourth doped region is connected to an erase line. The metal layer is formed over the second gate structure, and electrically connected to the third gate structure. The metal layer is connected to an assist gate line. The first gate structure includes a first gate oxide layer and a first polysilicon gate layer. The second gate structure includes a second gate oxide layer and a second polysilicon gate layer. The third gate structure includes a third gate oxide layer and a third polysilicon gate layer. The first doped region, the first gate structure and the second doped region are collaboratively formed as a first select transistor. The second doped region, the second gate structure and the third doped region are collaboratively formed as a first floating gate transistor. The second gate structure and the fourth doped region are collaboratively formed as a first MOS capacitor. The second polysilicon gate layer and the third polysilicon gate layer are collaboratively formed as a first poly/poly plate capacitor. The second polysilicon gate layer and the metal layer are collaboratively formed as a first metal/poly plate capacitor. Moreover, a first memory cell of the array structure includes the first select transistor, the first floating gate transistor, the first MOS capacitor, the first poly/poly plate capacitor and the first metal/poly plate capacitor.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 1A (prior art) is a schematic top view illustrating a conventional single-poly non-volatile memory cell;

FIG. 1B (prior art) is a schematic equivalent circuit diagram of the single-poly non-volatile memory cell as shown in FIG. 1A;

FIG. 3A is a bias voltage table illustrating the bias voltages for performing a program action, an erase action and a read action on the memory cell according to the first embodiment of the present invention;

FIG. 3B is a schematic circuit diagram the operations of performing the program action on the memory cell according to the first embodiment of the present invention;

FIG. 3C is a schematic circuit diagram the operations of performing the erase action on the memory cell according to the first embodiment of the present invention;

FIG. 3D is a schematic circuit diagram the operations of performing the read action on the memory cell according to the first embodiment of the present invention;

FIG. 4A is a schematic top view illustrating an array structure of with plural memory cells of the first embodiment;

FIG. 4B is a schematic circuit diagram illustrating the equivalent circuit of the array structure as shown in FIG. 4A;

FIG. 5A schematically illustrates the structure of a variant example of the single-poly non-volatile memory cell according to the first embodiment of the present invention;

FIG. 5B is a bias voltage table illustrating the bias voltages for performing a program action, an erase action and a read action on the memory cell as shown in FIG. 5A;

FIG. 6A schematically illustrates the structure of a single-poly non-volatile memory cell according to a second embodiment of the present invention;

DETAILED DESCRIPTION OF PREFERRED EMBODIMENTS

FIGS. 2A to 2G schematically illustrate the steps of a method of manufacturing a single-poly non-volatile memory cell according to a first embodiment of the present invention. FIG. 2H is a schematic equivalent circuit diagram of the single-poly non-volatile memory cell according to the first embodiment of the present invention. Hereinafter, the single-poly non-volatile memory cell is referred as a memory cell.

Figure 2A:
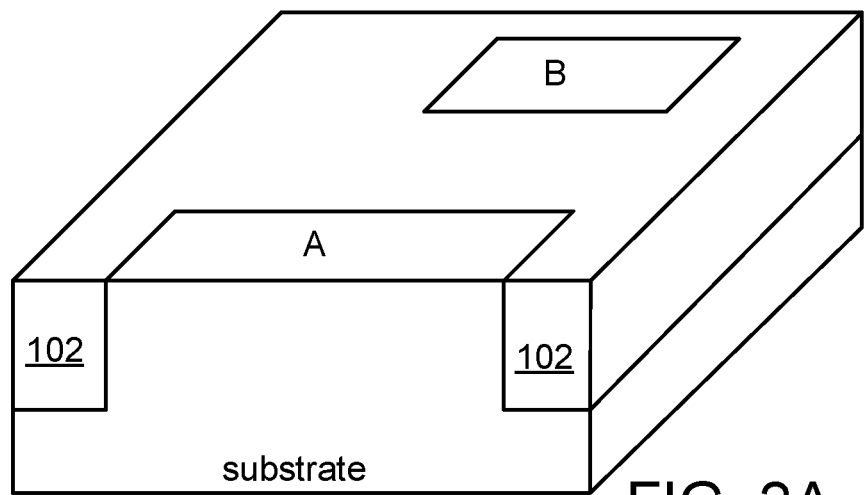
FIGS. 2A to 2G schematically illustrate the steps of a method of manufacturing a single-poly non-volatile memory cell according to a first embodiment of the present invention.

As shown in FIG. 2A, an isolation structure forming step is performed. Firstly, an isolation structure such as a shallow trench isolation (STI) structure 102 is formed on a substrate which can be a semiconductor substrate (such as a p-type substrate (p-sub) or a n-type substrate (n-sub)), or a glass substrate, or other types of substrate. Due to the STI structure 102, a region A and a region B is defined. The substrate is covered by the STI structure 102. The surface of the substrate corresponding to the region A and the region B is exposed. In the subsequent steps, two serially-connected n-type transistors are formed in the region A, and an erase gate region is formed in the region B.

Figure 2B:
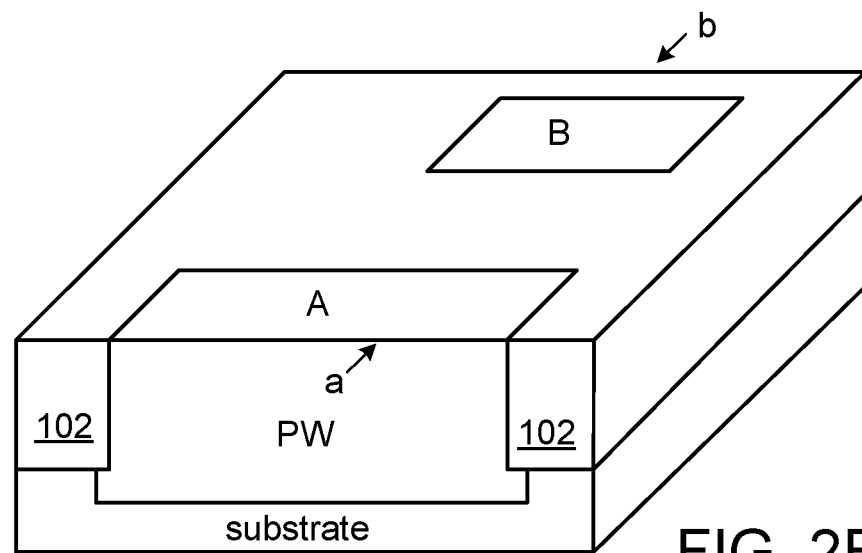

Then, a well region forming step is performed. As shown in FIG. 2B, the region A is exposed, and a first well region, such as a P-well region PW, is formed in the surface of the substrate corresponding to the region A.

Figure 2C:
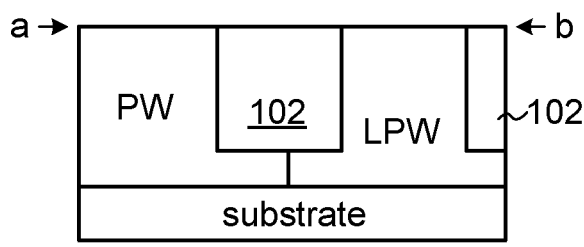

Also, another well region forming step is performed in the surface of the substrate corresponding to the region B. As shown in FIG. 2C, it is a schematic cross-sectional view taken along the line a-b of FIG. 2B after the another well region forming step. A second well region, such as a lightly-doped P-well region LPW, is formed in the surface of the substrate corresponding to the region B, and the second well region is contact with the first well region under the STI structure 102. In other embodiments, the second well region may be a P-well region PW or a N-well region NW.

Figure 2D:
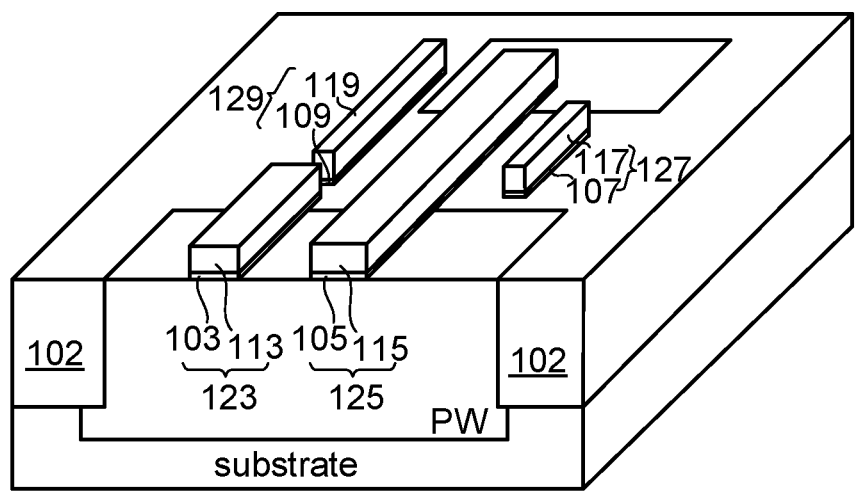

Then, a gate structure forming step is performed. As shown in FIG. 2D, four polysilicon gate layers 113, 115, 117 and 119 are formed over the substrate. In some embodiments, four gate oxide layers 103, 105, 107 and 109 are further formed between the surface of the substrate and the four polysilicon gate layers 113, 115, 117 and 119, respectively, before the four polysilicon gate layers. Consequently, four gate structures 123, 125, 127 and 129 are formed.

Please refer to FIG. 2D again. The two gate structures 123 and 125 are formed on the surface of the region A. In addition, the region A is divided into three sub-regions by the two gate structures 123 and 125. The gate structure 125 is extended externally to the region B through the surface of the STI structure 102. In addition, a portion of the region B is covered by the gate structure 125. The polysilicon gate layer 115 of the gate structure 125 is served as a floating gate. The polysilicon gate layer 113 of the gate structure 123 is served as a select gate.

In this embodiment, the two gate structures 127 and 129 cover the STI structure 102 only. The two gate structures 127 and 129 are located beside two opposite sides of the gate structure 125. In addition, the two gate structures 127 and 129 are not contacted with the gate structure 125.

Figure 2E:
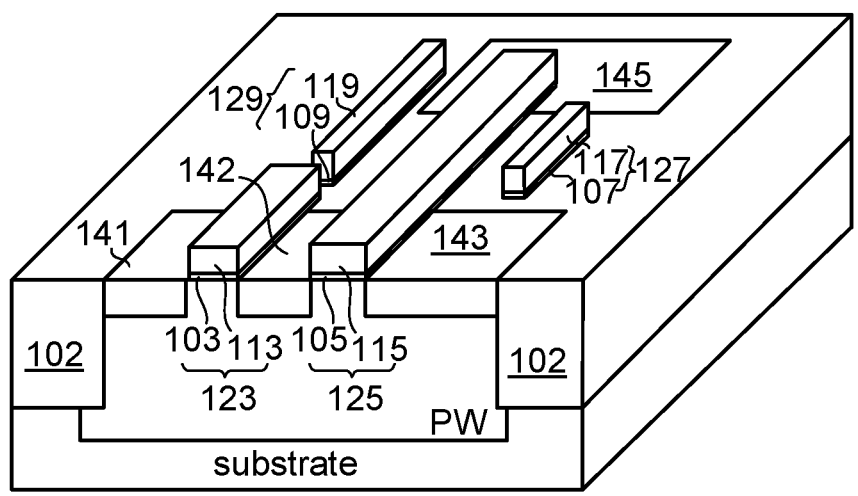

Please refer to FIG. 2E. Then, a doped region forming step is performed. In an embodiment, a doping process is performed to form four n-type doped regions 141, 142, 143 and 145 by using the two gate structures 123 and 125 as the mask. That is, these n-type doped regions 141, 142 and 143 are formed in the three sub-regions of the region A that is not covered by the two gate structures 123 and 125. In addition, the n-type doped region 145 is formed in the portion of the region B that is not covered by the gate structure 125.

In the region A, the gate structure 123 and the two n-doped regions 141 and 142 on its two sides are collaboratively formed as a select transistor. In addition, the gate structure 125 and the two n-doped regions 142 and 143 on its two sides are collaboratively formed as a floating gate transistor. In this embodiment, the floating gate transistor and the select transistor are n-type transistors and constructed in the P-well region PW. That is, the body terminal of the floating gate transistor and the body terminal of the select transistor are connected to the P-well region PW.

In the region B, the n-type doped region 145 is an erase gate region. The gate structure 125 is externally extended and located beside the erase gate region. Consequently, the erase gate region and the gate structure 125 are collaboratively formed as an n-type transistor. In addition, the n-type transistor is connected as a MOS capacitor.

Figure 2F:
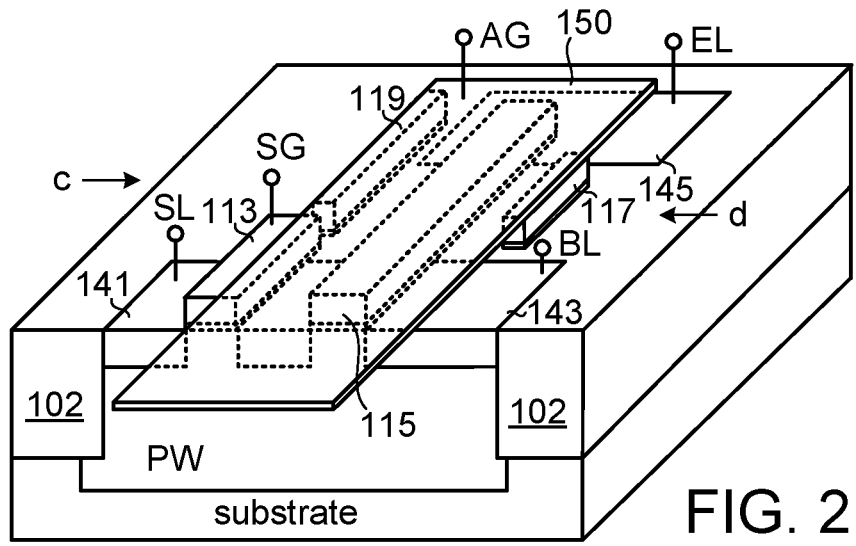

Please refer to FIG. 2F. Then, a metal layer 150 is formed over the polysilicon gate layer 115 but not contacted with the polysilicon gate layer 115. The metal layer 150 is electrically connected to the two polysilicon gate layers 117 and 119. After a step of forming metal conductor lines is completed, the memory cell of the first embodiment is fabricated. That is, the n-type doped region 141 is connected to a source line SL, the n-type doped region 143 is connected to a bit line BL, the n-type doped region 145 is connected to an erase line EL, the polysilicon gate layer 113 is connected to a select gate line SG, and the metal layer 150 is connected to an assist gate line AG. According to the embodiment of the invention, at least 50% area of the polysilicon gate layer 115 overlaps with the metal layer 150. In other words, at least 50% of the area of the polysilicon gate layer 115 is overlapped by the projection of the metal layer 150.

Figure 2G:
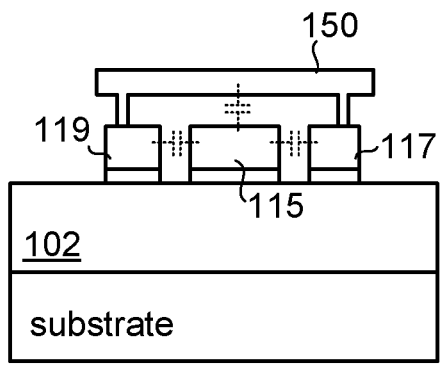
Figure 2H:
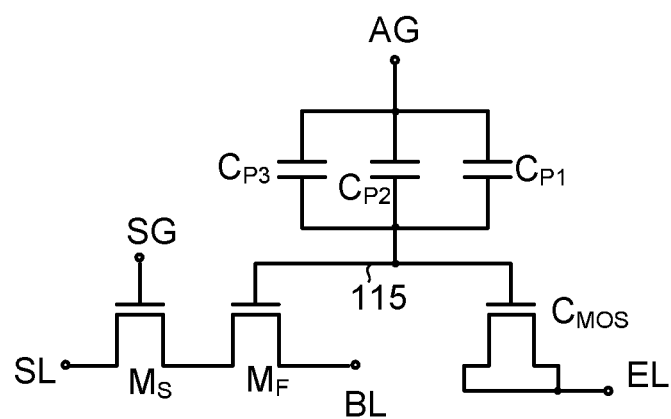
FIG. 2H is a schematic equivalent circuit diagram of the single-poly non-volatile memory cell according to the first embodiment of the present invention.

FIG. 2G is a schematic cross-sectional view illustrating the resulting structure of FIG. 2F and taken along the line c-d. In this embodiment, the gate structures 127 and 129 are disposed on the surface of the STI structure 102. In addition, the metal layer 150 is located over the polysilicon gate layer 115 and electrically connected to the two polysilicon gate layers 117 and 119. Consequently, the polysilicon gate layer 115 and the polysilicon gate layer 117 are collaboratively formed as a first poly/poly plate capacitor, and the polysilicon gate layer 115 and the polysilicon gate layer 119 are collaboratively formed as a second poly/poly plate capacitor. In addition, the polysilicon gate layer 115 and the metal layer 150 are collaboratively formed as a metal/poly plate capacitor.

As shown in FIG. 2H, the memory cell of the first embodiment comprises a select transistor Ms, a floating gate transistor MF, a MOS capacitor $C_{MOS}$, a first poly/poly plate capacitor $C_{P1}$, a metal/poly plate capacitor $C_{P2}$ and a second poly/poly plate capacitor $C_{P3}$. The first poly/poly plate capacitor $C_{P1}$, the metal/poly plate capacitor $C_{P2}$ and the second poly/poly plate capacitor $C_{P3}$ are connected with each other in parallel.

The gate terminal of the select transistor MS is connected to the select gate line SG. The first drain/source terminal of the select transistor Ms is connected to the source line SL. The first drain/source terminal of the floating gate transistor MF is connected to the second drain/source terminal of the select transistor MS. The second drain/source terminal of the floating gate transistor MF is connected to the bit line BL.

The first terminal of the MOS capacitor $C_{MOS}$ is connected to the floating gate 115. The second terminal of the MOS capacitor $C_{MOS}$ is connected to the erase line EL. The first terminal of the first poly/poly plate capacitor $C_{P1}$ is connected to the floating gate 115. The second terminal of the first poly/poly plate capacitor $C_{P1}$ is connected to the assist gate line AG. The first terminal of the metal/poly plate capacitor $C_{P2}$ is connected to the floating gate 115. The second terminal of the metal/poly plate capacitor $C_{P2}$ is connected to the assist gate line AG. The first terminal of the second poly/poly plate capacitor $C_{P3}$ is connected to the floating gate 115. The second terminal of the second poly/poly plate capacitor $C_{P3}$ is connected to the assist gate line AG.

As mentioned above, an assist gate region of the memory cell of the first embodiment is composed of the three plate capacitors $C_{P1}$, $C_{P2}$ and $C_{P3}$. The structures and the fabricating processes of the plate capacitors $C_{P1}$, $C_{P2}$ and $C_{P3}$ are simple. In addition, the uses of the plate capacitors $C_{P1}$, $C_{P2}$ and $C_{P3}$ can effectively reduce the size of the memory cell.

FIG. 3A is a bias voltage table illustrating the bias voltages for performing a program action, an erase action and a read action on the memory cell according to the first embodiment of the present invention. FIG. 3B is a schematic circuit diagram the operations of performing the program action on the memory cell according to the first embodiment of the present invention. FIG. 3C is a schematic circuit diagram the operations of performing the erase action on the memory cell according to the first embodiment of the present invention. FIG. 3D is a schematic circuit diagram the operations of performing the read action on the memory cell according to the first embodiment of the present invention.

While the program action (PGM), the erase action (ERS) and the read action (Read) are performed, the P-well region and the source line SL receive a ground voltage (0V). Moreover, the assist gate line voltage $V_{AG}$ is higher than the erase voltage $V_{EE}$, the erase voltage $V_{EE}$ is higher than the program voltage $V_{PP}$, the program voltage $V_{PP}$ is higher than the read voltage $V_R$, and the read voltage $V_R$ is higher than the ground voltage (0V). For example, the assist gate line voltage $V_{AG}$ is 15V, the erase voltage $V_{EE}$ is 12V, the program voltage $V_{PP}$ is 9V, and the read voltage $V_R$ is 5V.

Please refer to FIG. 3B. While the program action is performed, the bit line BL receives a program voltage $V_{PP}$, the select gate line SG receives the program voltage $V_{PP}$, the erase line EL receives a voltage between the ground voltage (0V) and the erase voltage $V_{EE}$, and the assist gate line AG receives a voltage between the ground voltage (0V) and the assist gate line voltage $V_{AG}$.

While the program action is performed, the select transistor Ms is turned on, and a program current IP is generated between the bit line BL and the source line SL. When the hot carriers (e.g., electrons) of the program current IP flow through a channel region corresponding to the floating gate 115, a channel hot effect (CHE) effect is generated. Due to the CHE effect, the hot carriers are injected into the floating gate 115. The voltage received by the assist gate line AG is helpful to increase the number of the hot carriers injected into the floating gate 115. Consequently, the programming efficiency is enhanced.

According to the present invention, since the polysilicon gate layer 119 and 117 are formed over the STI structure 102, a higher assist gate line voltage $V_{AG}$ can be supplied to the metal layer 150 and polysilicon gate layers 119, 117 to effectively improve the coupling ratio during the program action (PGM). In comparison with the present memory cell and the conventional memory cell, when the two assist gate regions have the same size, the memory cell of the present invention has a better coupling ratio. In other words, the size of the present memory cell can be reduced when the two assist gate regions have the same coupling ratio.

Please refer to FIG. 3C. While the erase action is performed, the bit line BL receives the ground voltage (0V), the select gate line SG receives the ground voltage (0V), the erase line EL receives the erase voltage $V_{EE}$, and the assist gate line AG receives a voltage between the negative value of the assist gate line voltage $-V_{AG}$ and the ground voltage (0V).

While the erase action is performed, the select transistor MS is turned off. Under this circumstance, a Fowler-Nordheim Tunneling (FN) effect is generated between the two terminals of the MOS capacitor $C_{MOS}$. Consequently, hot carriers are ejected from the floating gate 115 to the erase line EL. The voltage received by the assist gate line AG is helpful to increase the speed of ejecting the hot carriers from the floating gate 115. Consequently, the erasing efficiency is enhanced.

Please refer to FIG. 3D. While the read action is performed, the bit line BL receives the read voltage $V_R$, the source line SL receives the ground voltage (0V), the select gate line SG receives the read voltage $V_R$, the erase line EL receives the ground voltage (0V), and the assist gate line AG receives a voltage between the negative and the positive value of the assist gate line voltage $V_{AG}$ (i.e. $-V_{AG} \sim V_{AG}$). According to the voltage received by the assist gate line AG, the magnitude of a read current $I_R$ is correspondingly adjusted.

While the read action is performed, the select transistor MS is turned off, and the read current $I_R$ is generated between the bit line BL and the source line SL. The storage state of the memory cell can be determined according to the magnitude of the read current $I_R$. For example, in case that the electrons are stored in the floating gate 115, the magnitude of the read current $I_R$ is very low (e.g., nearly zero). Consequently, it is determined that the memory cell is in a first storage state. Whereas, in case that no electrons are stored in the floating gate 115, the magnitude of the read current $I_R$ is very high. Under this circumstance, it is determined that the memory cell is in a second storage state.

Moreover, plural memory cells of the first embodiment can be collaboratively formed as an array structure.

FIG. 4A is a schematic top view illustrating an array structure of with plural memory cells of the first embodiment. FIG. 4B is a schematic circuit diagram illustrating the equivalent circuit of the array structure as shown in FIG. 4A. The array structure comprises four memory cells in a 2×2 array. The array structure is connected to the source line SL, the select gate lines SG1, SG2, the bit lines BL1, BL2, the erase line EL and the assist gate line AG. The array structure comprises plural n-type doped regions 411, 412, 413, 414, 415, 416, 431, 432, 433, 434, 435, plural polysilicon gate layers 423, 425, 427, 429, 443, 445, 447, 449, 452, 454, 456, 458, and a metal layer 560. The metal layer 560 is indicated by oblique lines.

The structure of each memory cell is similar to that of FIG. 2F. For succinctness, only the structure of the memory cell c11 will be described as follows, and the structures of the other memory cells are not redundantly described herein. In the memory cell c11, the polysilicon gate layer 423 and the two n-doped regions 411 and 412 are collaboratively formed as a select transistor, and the polysilicon gate layer 425 and the two n-doped regions 412 and 413 are collaboratively formed as a floating gate transistor. In addition, the polysilicon gate layer 425 and the n-doped region 416 are collaboratively formed as an n-type transistor, and the n-type transistor is connected as a MOS capacitor. The polysilicon gate layer 425 and the polysilicon gate layer 454 are collaboratively formed as a first poly/poly plate capacitor. The polysilicon gate layer 425 and the polysilicon gate layer 452 are collaboratively formed as a second poly/poly plate capacitor. The polysilicon gate layer 425 and the metal layer 560 are collaboratively formed as a metal/poly plate capacitor.

The n-type doped region 411 is connected to the source line SL. The n-type doped region 413 is connected to the bit line BL. The polysilicon gate layer 423 is connected to the select gate line SG. The n-type doped region 416 is connected to the erase line EL. The metal layer 560 is connected to the polysilicon gate layers 452 and 454. The metal layer 560 is connected to the assist gate line AG.

The equivalent circuit of the array structure is shown in FIG. 4B. The array structure comprises four memory cells c11~c22 in a 2×2 array. The structures of these memory cells c11~c22 are identical. For succinctness, only the structure of the memory cell c11 will be described as follows, and the structures of the other memory cells are not redundantly described herein. The first poly/poly plate capacitor, the second poly/poly plate capacitor and the metal/poly plate capacitor of the memory cell c11 are connected with each other in parallel. Consequently, an equivalent plate capacitor $C_{Pth}$ of these plate capacitors is shown in the drawing.

The connecting relationships between associated components of the memory cells c11 will be described as follows. The first drain/source terminal of the select transistor Ms is connected to the source line SL. The gate terminal of the select transistor Ms is connected to the select gate line SG1. The second drain/source terminal of the floating gate transistor MF is connected to the bit line BL. The first terminal of the MOS capacitor $C_{MOS}$ is connected to the floating gate of the floating gate transistor MF. The second terminal of the MOS capacitor $C_{MOS}$ is connected to the erase line EL. The first terminal of the equivalent plate capacitor $C_{Pth}$ is connected to the floating gate of the floating gate transistor MF. The second terminal of the equivalent plate capacitor $C_{Pth}$ is connected to the assist gate line AG.

Similarly, by providing proper bias voltages to the source line SL, the select gate lines SG1, SG2, the bit lines BL1, BL2, the erase line EL and the assist gate line AG, a program action, an erase action or a read action can be selectively performed on the memory cells c11~c22 of the array structure.

In the first embodiment, the select transistor and the floating transistor of the memory cell are n-type transistors. It is noted that numerous modifications and alterations may be made while retaining the teachings of the invention. For example, in another embodiment, the n-type select transistor and floating gate transistor are replaced by p-type transistors. In addition, the memory cell and the array structure with the p-type transistors can be implemented according to the teachings of the first embodiment.

FIG. 5A schematically illustrates the structure of a variant example of the single-poly non-volatile memory cell according to the first embodiment of the present invention. In comparison with the memory cell of FIG. 2E, the select transistor and the floating gate transistor of the memory cell of this embodiment are p-type transistors. The memory cell of this embodiment is constructed in a first well region, such as an N-well region NW. Also, three p-doped regions 501, 502 and 503 are formed in the N-well region NW. Furthermore, a second well region (not shown), such as a N-well region NW, a lightly-doped P-well region LPW or a P-well region PW, is formed in the surface of the substrate corresponding to the region B. The lightly-doped P-well region LPW or the P-well region PW as the second well region is not contact with the N-well region NW as the first well region under the STI structure 102. Also, a n-doped region 504 is formed in the second well region.

FIG. 5B is a bias voltage table illustrating the bias voltages for performing a program action, an erase action and a read action on the memory cell as shown in FIG. 5A. In an embodiment, the assist gate line voltage $V_{AG}$ is higher than the erase voltage $V_{EE}$, the erase voltage $V_{EE}$ is higher than the program voltage $V_{PP}$, the program voltage $V_{PP}$ is higher than the read voltage $V_R$, and the read voltage $V_R$ is higher than the ground voltage (0V). The program action (PGM), the erase action (ERS) and the read action (Read) are similar to those of the first embodiment, and not redundantly described herein.

Moreover, the memory cell of the first embodiment may be further modified to reduce the size of the memory cell or achieve the better layout configuration. FIG. 6A schematically illustrates the structure of a single-poly non-volatile memory cell according to a second embodiment of the present invention.

As mentioned above, the memory cell of FIG. 2E comprises the gate structures 123 and 129. In this embodiment, the gate structure 129 is omitted, and the gate structure 123 is extended. That is, a gate oxide layer 603 and a polysilicon gate layer 613 of the gate structure 623 are extended from the region A to the adjacent memory cell. The other components of the memory cell of this embodiment are similar to those of the memory cell of the first embodiment, and not redundantly described herein.

In this embodiment, the polysilicon gate layer 115 and the polysilicon gate layer 117 are collaboratively formed as a poly/poly plate capacitor, and the polysilicon gate layer 115 and the metal layer 150 are collaboratively formed as a metal/poly plate capacitor.

Figure 6B:
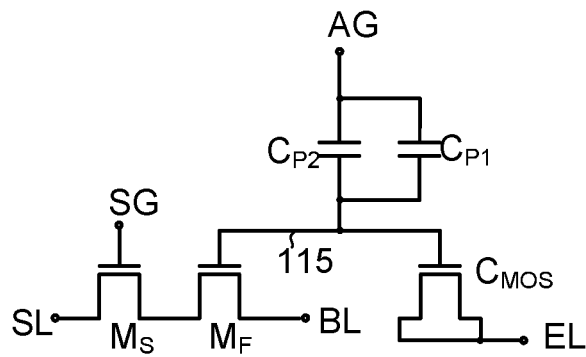
FIG. 6B is a schematic equivalent circuit diagram of the single-poly non-volatile memory cell as shown in FIG. 6A.

FIG. 6B is a schematic equivalent circuit diagram of the single-poly non-volatile memory cell as shown in FIG. 6A. In comparison with the equivalent circuit of FIG. 2G, only two plate capacitors $C_{P1}$ and $C_{P2}$ in the memory cell of this embodiment are connected with each other in parallel. For brevity, only the connecting relationship between these two plate capacitors will be described as follows.

The first terminal of the poly/poly plate capacitor $C_{P1}$ is connected to the floating gate 115. The second terminal of the poly/poly plate capacitor $C_{P1}$ is connected to the assist gate line AG. The first terminal of the metal/poly plate capacitor $C_{P2}$ is connected to the floating gate 115. The second terminal of the metal/poly plate capacitor $C_{P2}$ is connected to the assist gate line AG.

In this embodiment, the assist gate region is composed of the two plate capacitors $C_{P1}$ and $C_{P2}$. The structures and the fabricating processes of the plate capacitors $C_{P1}$ and $C_{P2}$ are simple. In addition, the uses of the plate capacitors $C_{P1}$ and $C_{P2}$ can effectively reduce the size of the memory cell.

Similarly, the program action, the erase action and the read action can be performed on the memory cell of the second embodiment according to the bias voltage table of FIG. 3A. Of course, the n-type transistors of the memory cell of the second embodiment may be replaced by p-type transistors. Under this circumstance, the program action, the erase action and the read action can be performed on the memory cell of the second embodiment according to the bias voltage table of FIG. 5B. Similarly, plural memory cells of the second embodiment can be collaboratively formed as an array structure. The associated operations can be performed on the array structures.

Figure 6C:
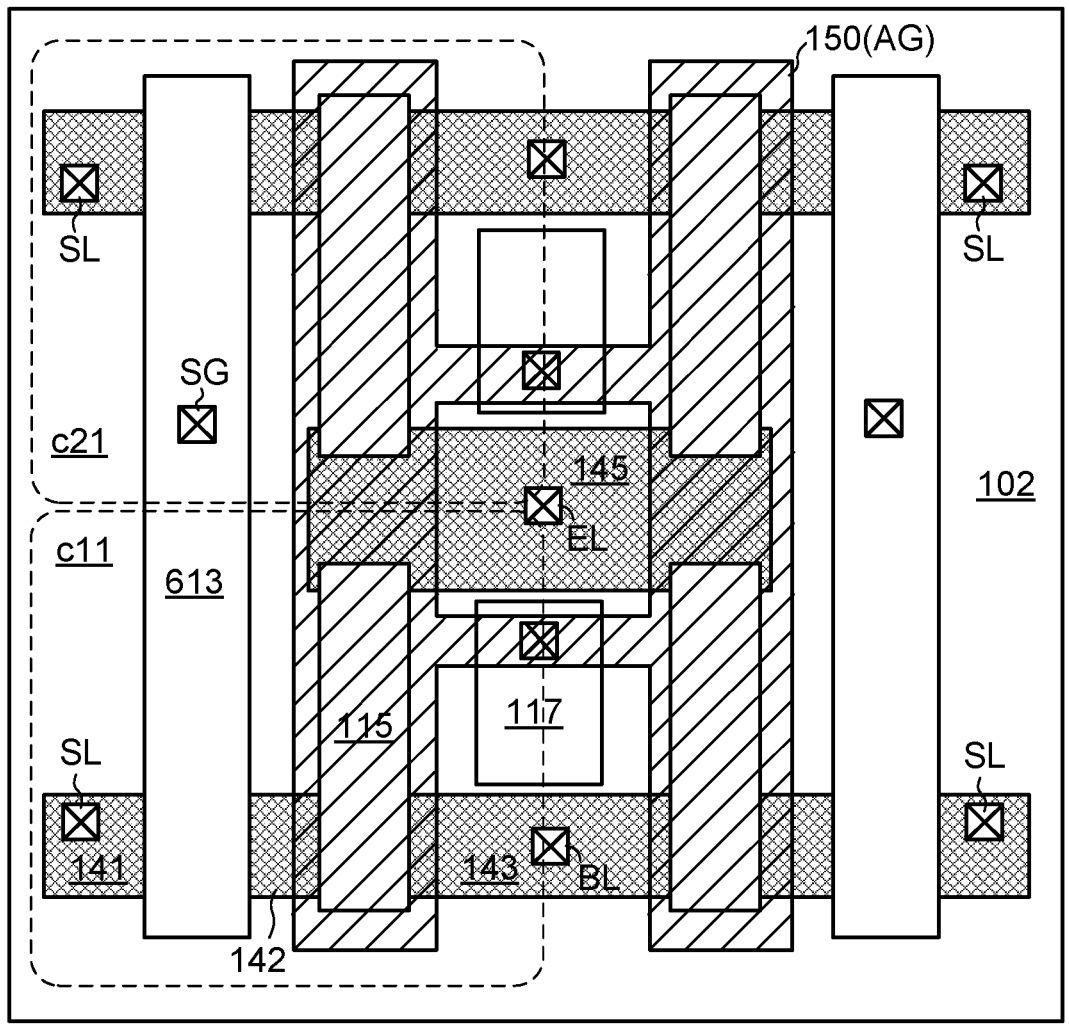
FIG. 6C is a schematic top view illustrating an array structure of with plural memory cells of the second embodiment.

FIG. 6C is a schematic top view illustrating an array structure of with plural memory cells of the second embodiment. The array structure comprises four memory cells in a 2×2 array. In this array structure, a polysilicon gate layer 613 of the gate structure 623 is shared by the select transistor in this memory cell c11 and the selector transistor in an adjacent memory cell c21. The other array structure is similar to that of FIG. 4A, and is not redundantly described herein.

Figure 7A:
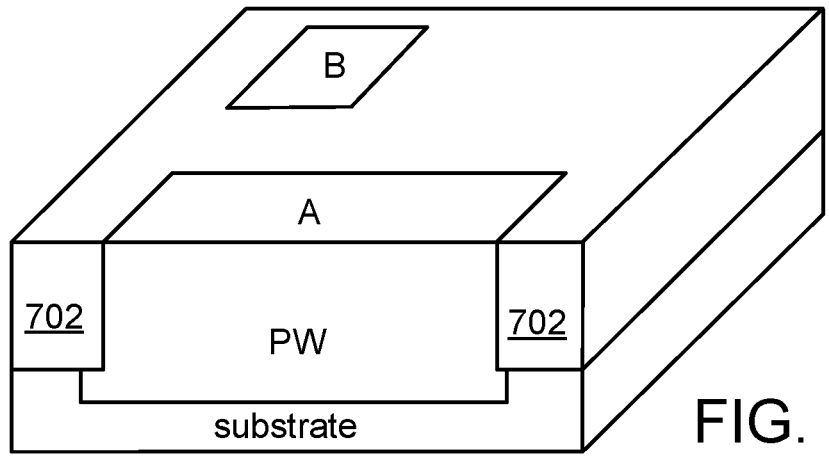
FIGS. 7A to 7C schematically illustrate the steps of a method of manufacturing a single-poly non-volatile memory cell according to a third embodiment of the present invention.
Figure 7B:
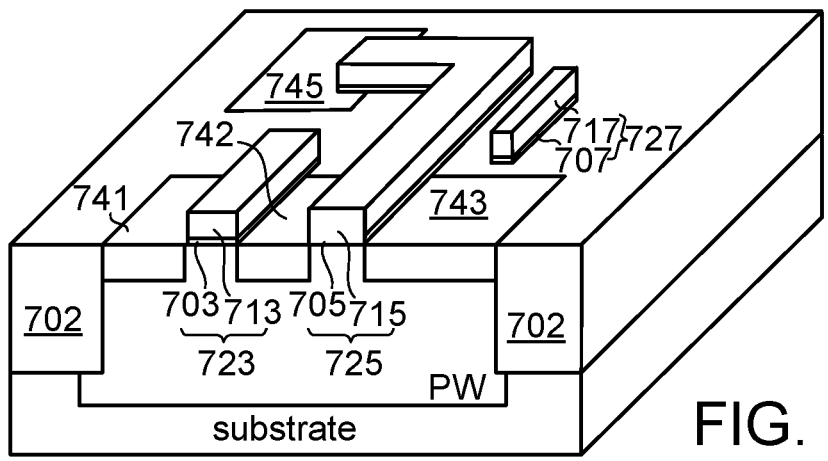
Figure 7C:
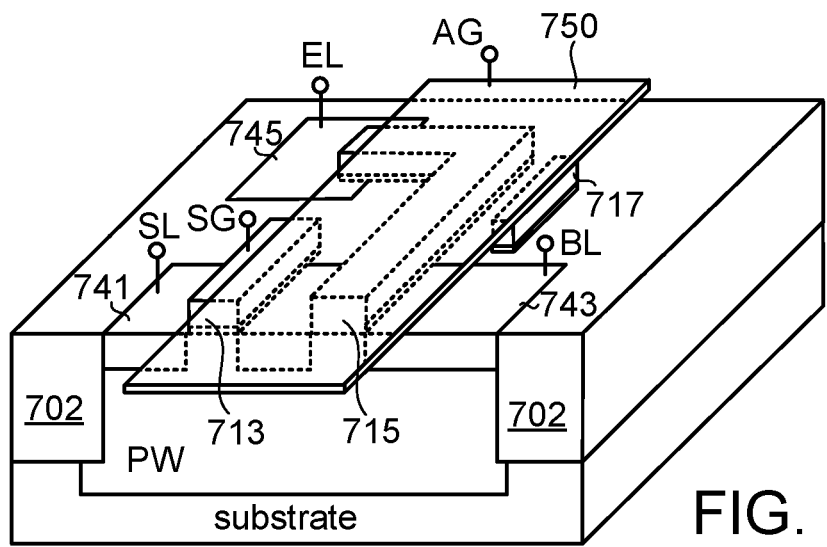

FIGS. 7A to 7C schematically illustrate the steps of a method of manufacturing a single-poly non-volatile memory cell according to a third embodiment of the present invention. In comparison with the memory cell of the first embodiment, the memory cell of this embodiment has an L-shaped floating gate. Similar to the previous embodiments, the memory cell of the third embodiment may improve the coupling ratio during the program action (PGM).

As shown in FIG. 7A, a shallow trench isolation (STI) structure 702 is formed on a substrate to define a region A and a region B. The substrate is covered by the STI structure 702. The surface of the substrate is exposed through the region A and the region B. Then, a well region forming step is performed. Consequently, a first well region, such as a P-well region PW, is formed in the surface of the substrate corresponding to the region A. Moreover, another well region forming step is performed to form a second well region (not shown), such as a lightly-doped P-well region LPW, a P-well region PW or a N-well region NW, in the surface of the substrate corresponding to the region B.

Then, as shown in FIG. 7B, three gate oxide layers 703, 705 and 707 are formed on the surface of the substrate. Then, three polysilicon gate layers 713, 715 and 717 are formed on the three gate oxide layers 703, 705 and 707, respectively. Consequently, three gate structures 723, 725 and 727 are formed.

Please refer to FIG. 7B again. The two gate structures 723 and 725 are formed on the surface of the region A. In addition, the region A is divided into three sub-regions by the two gate structures 723 and 725. Moreover, the gate structure 725 is an L-shaped structure. The L-shaped gate structure 725 is bent and extended to the left side (first side) so the gate structure 725 does not connect with the gate structure 727 on the right side (second side). That is to say, the gate structure 725 is extended externally to the region B through the surface of the STI structure 702. In addition, a portion of the region B is covered by the gate structure 725. The gate structure 727 covers the surface of the STI structure 702 only. In addition, the gate structure 727 is located beside the second side of the gate structure 725.

Then, a doping process is performed on the surface of the substrate by using the two gate structures 723 and 725 as the mask. Consequently, three n-type doped regions 741, 742 and 743 are formed in the three sub-regions of the region A that is not covered by the two gate structures 723 and 725. In addition, an n-type doped region 745 is formed in the portion of the region B that is not covered by the gate structure 725.

In the region A, the gate structure 723 and the two n-doped regions 741 and 742 on its two sides are collaboratively formed as a select transistor. In addition, the gate structure 725 and the two n-doped regions 742 and 743 on its two sides are collaboratively formed as a floating gate transistor. The floating gate transistor and the select transistor are n-type transistors and constructed in the P-well region PW. That is, the body terminal of the floating gate transistor and the body terminal of the select transistor are connected to the P-well region PW.

In the region B, the n-type doped region 745 is an erase gate region. The gate structure 725 is externally extended and located beside the erase gate region. Consequently, the erase gate region and the gate structure 725 are collaboratively formed as an n-type transistor. The n-type transistor is connected as a MOS capacitor.

Please refer to FIG. 7C. Then, a metal layer 750 is formed over the polysilicon gate layer 715, and at least 50% area of the polysilicon gate layer 715 overlaps with the metal layer 750. The metal layer 750 is electrically connected to the polysilicon gate layer 717. After a step of forming metal conductor lines is performed, the memory cell of the third embodiment is fabricated. That is, the n-type doped region 741 is connected to a source line SL, the n-type doped region 743 is connected to a bit line BL, the n-type doped region 745 is connected to an erase line EL, the polysilicon gate layer 713 is connected to a select gate line SG, and the metal layer 750 is connected to an assist gate line AG.

In this embodiment, the gate structures 727 is disposed on the surface of the STI structure 702. In addition, the metal layer 750 is located over the gate structure 725. Consequently, the polysilicon gate layer 715 and the polysilicon gate layer 717 are collaboratively formed as a first poly/poly plate capacitor. In addition, the polysilicon gate layer 715 and the metal layer 750 are collaboratively formed as a metal/poly plate capacitor.

As mentioned above, the assist gate region of the memory cell of this embodiment is composed of two plate capacitors. The equivalent circuit of the memory cell of this embodiment is similar to that of FIG. 6B. Similarly, the program action, the erase action and the read action can be performed on the memory cell of the third embodiment according to the bias voltage table of FIG. 3A. Of course, the n-type transistors of the memory cell of the third embodiment may be replaced by p-type transistors. Under this circumstance, the program action, the erase action and the read action can be performed on the memory cell of the third embodiment according to the bias voltage table of FIG. 5B. Similarly, plural memory cells of the third embodiment can be collaboratively formed as an array structure. The associated operations can be performed on the array structures.

Figure 8A:
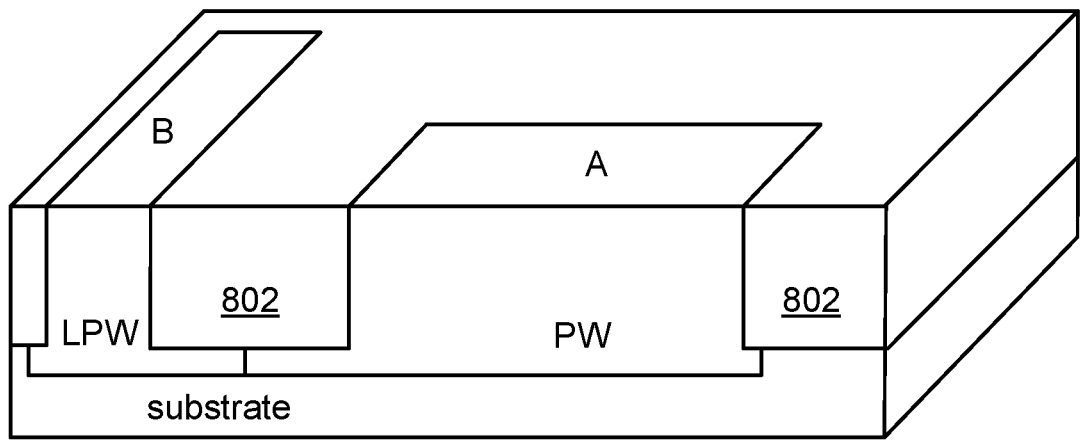
FIGS. 8A to 8C schematically illustrate the steps of a method of manufacturing a single-poly non-volatile memory cell according to a fourth embodiment of the present invention.
Figure 8B:
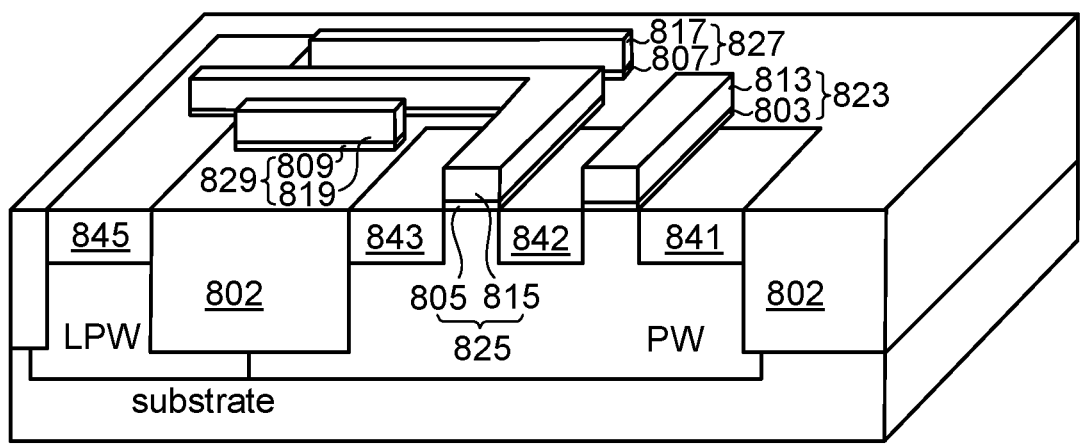
Figure 8C:
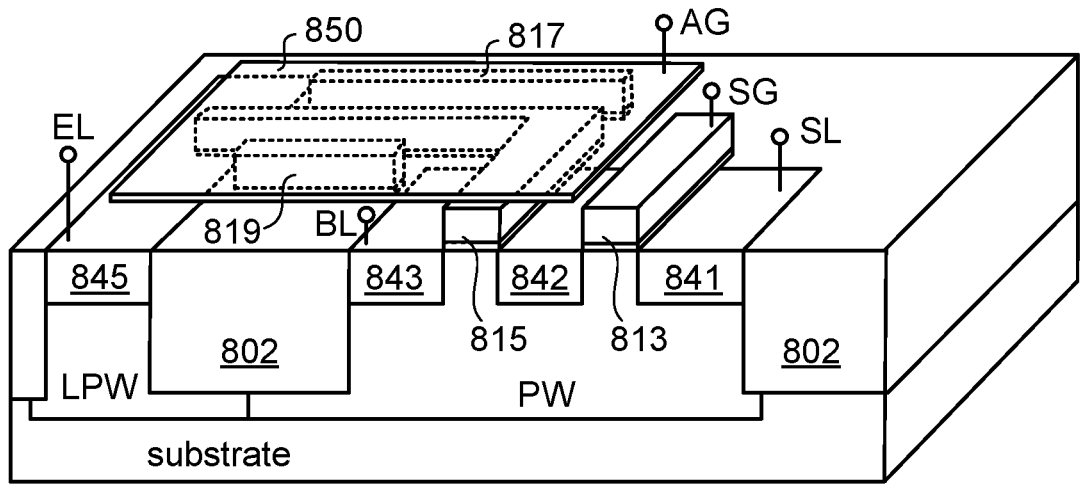

FIGS. 8A to 8C schematically illustrate the steps of a method of manufacturing a single-poly non-volatile memory cell according to a fourth embodiment of the present invention. Like the memory cell of the third embodiment, the memory cell of this embodiment has an L-shaped floating gate.

As shown in FIG. 8A, a shallow trench isolation (STI) structure 802 is formed in a substrate to define a region A and a region B. The substrate is covered by the STI structure 802. The surface of the substrate is exposed through the region A and the region B. Then, a well region forming step is performed. Consequently, a first well region, such as P-well region PW, is formed in the surface of the substrate corresponding to the region A, and a second well region, such as lightly-doped P-well region LPW, a P-well region PW or a N-well region NW is formed in the surface of the substrate corresponding to the region B.

Then, as shown in FIG. 8B, four gate oxide layers 803, 805, 807 and 809 are formed on the surface of the substrate. Then, four polysilicon gate layers 813, 815, 817 and 819 are formed on the four gate oxide layers 803, 805, 807 and 809, respectively. Consequently, four gate structures 823, 825, 827 and 829 are formed.

Please refer to FIG. 8B again. The two gate structures 823 and 825 are formed on the surface of the region A. In addition, the region A is divided into three sub-regions by the two gate structures 823 and 825. Moreover, the gate structure 825 is an L-shaped structure. The gate structure 825 is extended externally to the region B through the surface of the STI structure 802. In addition, a portion of the region B is covered by the gate structure 825. The gate structures 827 and 829 cover the surface of the STI structure 802 only. In addition, the two gate structures 827 and 829 are located beside two opposite sides of the gate structure 825. The two gate structures 827 and 829 are not contacted with the gate structure 825.

Then, a doping process is performed on the surface of the substrate by using the two gate structures 823 and 825 as the mask. Consequently, three n-type doped regions 841, 842 and 843 are formed in the three sub-regions of the region A that is not covered by the two gate structures 823 and 825. In addition, an n-type doped region 845 is formed in the portion of the region B that is not covered by the gate structure 825.

In the region A, the gate structure 823 and the two n-doped regions 841 and 842 on its two sides are collaboratively formed as a select transistor. In addition, the gate structure 825 and the two n-doped regions 842 and 843 on its two sides are collaboratively formed as a floating gate transistor. The floating gate transistor and the select transistor are n-type transistors and constructed in the P-well region PW. That is, the body terminal of the floating gate transistor and the body terminal of the select transistor are connected to the P-well region PW.

In the region B, the n-type doped region 845 is an erase gate region. The gate structure 825 is externally extended and located beside the erase gate region. Consequently, the erase gate region and the gate structure 825 are collaboratively formed as an n-type transistor. The n-type transistor is connected as a MOS capacitor.

Please refer to FIG. 8C. Then, a metal layer 850 is formed over the polysilicon gate layer 815, and at least 50% area of the polysilicon gate layer 815 overlaps with the metal layer 850. The metal layer 850 is electrically connected to the two polysilicon gate layers 817 and 819. After a step of forming metal conductor lines is performed, the memory cell of the fourth embodiment is fabricated. That is, the n-type doped region 841 is connected to a source line SL, the n-type doped region 843 is connected to a bit line BL, the n-type doped region 845 is connected to an erase line EL, the polysilicon gate layer 813 is connected to a select gate line SG, and the metal layer 850 is connected to an assist gate line AG.

In this embodiment, the gate structures 827 and 829 are disposed on the surface of the STI structure 802. In addition, the metal layer 850 is located over the gate structure 825. Consequently, the polysilicon gate layer 815 and the polysilicon gate layer 817 are collaboratively formed as a first poly/poly plate capacitor, and the polysilicon gate layer 815 and the polysilicon gate layer 819 are collaboratively formed as a second poly/poly plate capacitor. In addition, the polysilicon gate layer 815 and the metal layer 850 are collaboratively formed as a metal/poly plate capacitor.

As mentioned above, the assist gate region of the memory cell of this embodiment is composed of three plate capacitors. The equivalent circuit of the memory cell of this embodiment is similar to that of FIG. 6B. Similarly, the program action, the erase action and the read action can be performed on the memory cell of the fourth embodiment according to the bias voltage table of FIG. 3A. Of course, the n-type transistors of the memory cell of the fourth embodiment may be replaced by p-type transistors. Under this circumstance, the program action, the erase action and the read action can be performed on the memory cell of the fourth embodiment according to the bias voltage table of FIG. 5B. Similarly, plural memory cells of the fourth embodiment can be collaboratively formed as an array structure. The associated operations can be performed on the array structures.

From the above descriptions, the present invention provides an erasable programmable single-poly non-volatile memory cell and an associated array structure. In the memory cell of the array structure, the assist gate region is composed at least two plate capacitors. Especially, the assist gate region at least contains a poly/poly plate capacitor and a metal/poly plate capacitor. The structures and the fabricating processes of the plate capacitors are simple. In addition, the uses of the plate capacitors can effectively reduce the size of the memory cell.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An array structure of erasable programmable non-volatile memory cells, the array structures being constructed in a substrate, the array structure comprising:
    an isolation structure formed on the substrate, wherein a surface of the substrate is divided into a first region and a second region by the isolation structure;
    a first well region formed in the surface of the substrate corresponding to the first region;
    a second well region formed in the surface of the substrate corresponding to the second region;
    a first gate structure and a second gate structure formed on the surface of the first region, wherein the first region is divided into a first doped region, a second doped region and a third doped region by the first gate structure and the second gate structure, the first gate structure is connected to a first select gate line, the second gate structure is extended externally to the second region through a surface of the isolation structure, and a portion of the second region is covered by the second gate structure, the first doped region is connected to a source line, and the third doped region is connected to a first bit line;
    a third gate structure formed on the isolation structure, and located beside a first side of the second gate structure;
    a fourth doped region formed in the surface of the substrate corresponding to the second region, wherein the fourth doped region is connected to an erase line; and
    a metal layer formed over the second gate structure, and electrically connected to the third gate structure, wherein the metal layer is connected to an assist gate line;
    wherein the first gate structure comprises a first gate oxide layer and a first polysilicon gate layer, the second gate structure comprises a second gate oxide layer and a second polysilicon gate layer, and the third gate structure comprises a third gate oxide layer and a third polysilicon gate layer,
    wherein the first doped region, the first gate structure and the second doped region are collaboratively formed as a first select transistor, the second doped region, the second gate structure and the third doped region are collaboratively formed as a first floating gate transistor, the second gate structure and the fourth doped region are collaboratively formed as a first MOS capacitor, the second polysilicon gate layer and the third polysilicon gate layer are collaboratively formed as a first poly/poly plate capacitor, and the second polysilicon gate layer and the metal layer are collaboratively formed as a first metal/poly plate capacitor,
    wherein a first memory cell of the array structure comprises the first select transistor, the first floating gate transistor, the first MOS capacitor, the first poly/poly plate capacitor and the first metal/poly plate capacitor.

2. The array structure as claimed in claim 1, wherein in the first memory cell, a gate terminal of the first select transistor is connected to the first select gate line, a first drain/source terminal of the first select transistor is connected to the source line, a first drain/source terminal of the first floating gate transistor is connected to a second drain/source terminal of the first select transistor, a second drain/source terminal of the first floating gate transistor is connected to the first bit line, a first terminal of the first MOS capacitor is connected to a floating gate of the first floating gate transistor, a second terminal of the first MOS capacitor is connected to the erase line, a first terminal of the first poly/poly plate capacitor is connected to the floating gate of the first floating gate transistor, a second terminal of the first poly/poly plate capacitor is connected to the assist gate line, a first terminal of the first metal/poly plate capacitor is connected to the floating gate of the first floating gate transistor, and a second terminal of the first metal/poly plate capacitor is connected to the assist gate line.

3. The array structure as claimed in claim 2, wherein the array structure further comprises a second memory cell, wherein the second memory cell comprises a second select transistor, a second floating gate transistor, a second MOS capacitor, a second poly/poly plate capacitor and a second metal/poly plate capacitor, wherein the first polysilicon layer is shared by the second select transistor and the first select transistor.

4. The array structure as claimed in claim 1, wherein the array structure further comprises a fourth gate structure, and the fourth gate structure is formed on the isolation structure, wherein the fourth gate structure is located beside a second side of the second gate structure, and the fourth gate structure comprises a fourth gate oxide layer and a fourth polysilicon gate layer, wherein the second polysilicon gate layer and the fourth polysilicon gate layer are collaboratively formed as a second poly/poly plate capacitor.

5. The array structure as claimed in claim 4, wherein the first memory cell further comprises the second poly/poly plate capacitor, wherein a gate terminal of the first select transistor is connected to the first select gate line, a first drain/source terminal of the first select transistor is connected to the source line, a first drain/source terminal of the first floating gate transistor is connected to a second drain/source terminal of the first select transistor, a second drain/source terminal of the first floating gate transistor is connected to the first bit line, a first terminal of the first MOS capacitor is connected to a floating gate of the first floating gate transistor, a second terminal of the first MOS capacitor is connected to the erase line, a first terminal of the first poly/poly plate capacitor is connected to the floating gate of the first floating gate transistor, a second terminal of the first poly/poly plate capacitor is connected to the assist gate line, a first terminal of the first metal/poly plate capacitor is connected to the floating gate of the first floating gate transistor, a second terminal of the first metal/poly plate capacitor is connected to the assist gate line, a first terminal of the second poly/poly plate capacitor is connected to the floating gate of the first floating gate transistor, and a second terminal of the second poly/poly plate capacitor is connected to the assist gate line.

6. The array structure as claimed in claim 5, wherein the array structure further comprises a second memory cell, wherein the second memory cell comprises a second select transistor, a second floating gate transistor, a second MOS capacitor, a third poly/poly plate capacitor, a second metal/poly plate capacitor and a fourth poly/poly plate capacitor.

7. The array structure as claimed in claim 6, wherein a gate terminal of the second select transistor is connected to a second select gate line, a first drain/source terminal of the second select transistor is connected to the source line, a first drain/source terminal of the second floating gate transistor is connected to a second drain/source terminal of the second select transistor, a second drain/source terminal of the second floating gate transistor is connected to the first bit line, a first terminal of the second MOS capacitor is connected to a floating gate of the second floating gate transistor, a second terminal of the second MOS capacitor is connected to the erase line, a first terminal of the third poly/poly plate capacitor is connected to the floating gate of the second floating gate transistor, a second terminal of the third poly/poly plate capacitor is connected to the assist gate line, a first terminal of the second metal/poly plate capacitor is connected to the floating gate of the second floating gate transistor, a second terminal of the second metal/poly plate capacitor is connected to the assist gate line, a first terminal of the fourth poly/poly plate capacitor is connected to the floating gate of the second floating gate transistor, and a second terminal of the fourth poly/poly plate capacitor is connected to the assist gate line.

8. The array structure as claimed in claim 6, wherein a gate terminal of the second select transistor is connected to the first select gate line, a first drain/source terminal of the second select transistor is connected to the source line, a first drain/source terminal of the second floating gate transistor is connected to a second drain/source terminal of the second select transistor, a second drain/source terminal of the second floating gate transistor is connected to a second bit line, a first terminal of the second MOS capacitor is connected to a floating gate of the second floating gate transistor, a second terminal of the second MOS capacitor is connected to the erase line, a first terminal of the third poly/poly plate capacitor is connected to the floating gate of the second floating gate transistor, a second terminal of the third poly/poly plate capacitor is connected to the assist gate line, a first terminal of the second metal/poly plate capacitor is connected to the floating gate of the second floating gate transistor, a second terminal of the second metal/poly plate capacitor is connected to the assist gate line, a first terminal of the fourth poly/poly plate capacitor is connected to the floating gate of the second floating gate transistor, and a second terminal of the fourth poly/poly plate capacitor is connected to the assist gate line.

9. The array structure as claimed in claim 1, wherein the second gate structure is an L-shaped gate structure.

10. The array structure as claimed in claim 1, wherein the first select transistor and the first floating gate transistor are n-type transistors.

11. The array structure as claimed in claim 10, wherein while a program action is performed, the source line receives a ground voltage, the first select gate line receives a program voltage, the first bit line receives the program voltage, the erase line receives a first voltage in a range between the ground voltage and an erase voltage, and the assist gate receives a second voltage in a range between the ground voltage and an assist gate line voltage, wherein the assist gate voltage is higher than the erase voltage, the erase voltage is higher than the program voltage, and the program voltage is higher the ground voltage.

12. The array structure as claimed in claim 10, wherein while an erase action is performed, the source line receives a ground voltage, the first select gate line receives the ground voltage, the first bit line receives the ground voltage, the erase line receives an erase voltage, and the assist gate receives a voltage in a range between a negative value of an assist gate voltage and the ground voltage, wherein the assist voltage is higher than the erase voltage, and the erase voltage is higher than the ground voltage.

13. The array structure as claimed in claim 10, wherein while a read action is performed, the source line receives a ground voltage, the first select gate line receives a read voltage, the first bit line receives the read voltage, the erase line receives the ground voltage, the assist gate line receives a voltage in a range between a negative value of an assist gate line voltage and a positive value of the assist gate voltage, wherein the assist gate voltage is higher than the read voltage, and the read voltage is higher than the ground voltage.

* * * * *